(12) United States Patent
Krimmer et al.

(10) Patent No.: US 10,545,175 B2
(45) Date of Patent: Jan. 28, 2020

(54) ELECTRICAL MEASUREMENT SYSTEM AND METHOD FOR ESTABLISHING A DESIRED TOTAL OFFSET

(71) Applicant: Rohde & Schwarz GmbH & Co. KG, Munich (DE)

(72) Inventors: Roland Krimmer, Germering (DE); Alexander Kunze, Munich (DE); Andreas Ziegler, Munich (DE); Gottfried Czech, Wildpoldsried (DE); Mirko Soellner, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 339 days.

(21) Appl. No.: 15/470,625

(22) Filed: Mar. 27, 2017

(65) Prior Publication Data
US 2018/0275194 A1    Sep. 27, 2018

(51) Int. Cl.
*G01R 31/28* (2006.01)
*G01R 1/067* (2006.01)

(52) U.S. Cl.
CPC ......... *G01R 1/06766* (2013.01); *G01R 1/067* (2013.01)

(58) Field of Classification Search
CPC .......... G01R 31/31702; G01R 31/2831; G01R 31/2648; G01R 31/2642; G01R 31/26
See application file for complete search history.

(56) References Cited

U.S. PATENT DOCUMENTS

| 6,181,264 | B1 | 1/2001 | Felps | |
|---|---|---|---|---|
| 2012/0084036 | A1* | 4/2012 | Booman | G01R 1/06766 702/79 |
| 2012/0293195 | A1* | 11/2012 | Bourstein | G01R 31/31721 324/750.01 |
| 2017/0248631 | A1* | 8/2017 | Mende | G01R 1/067 |

* cited by examiner

*Primary Examiner* — Tung X Nguyen
(74) *Attorney, Agent, or Firm* — Christensen O'Connor Johnson Kindness PLLC

(57) ABSTRACT

An electrical measurement system for performing a measurement on a device under test has a main unit, a probe unit connected to the main unit, a first offset generator for generating a first offset influencing the measurement, and a second offset generator for generating a second offset influencing the measurement. The first offset generator has a first analog step size and the second offset generator has a second analog step size. The first and second analog step sizes differ from one another.

20 Claims, 3 Drawing Sheets

ELECTRICAL MEASUREMENT SYSTEM AND METHOD FOR ESTABLISHING A DESIRED TOTAL OFFSET

FIELD OF THE DISCLOSURE

Embodiments of the present disclosure relate generally to an electrical measurement system for performing a measurement on a device under test as well as a method for establishing a desired total offset influencing a measurement performed by an electrical measurement system.

BACKGROUND

When performing measurements on a device under test it is sometimes necessary to influence the measurement with an offset, for example by applying an offset voltage to the measurement line of the electrical measurement system.

Precise control over the offset across a broad range of offset values is desired to increase precision of the measurement itself.

In known digital electrical measurement systems, the offset is usually generated by a digital-to-analog converter (D/A converter). However, D/A converters with a very high precision and a broad range of output voltages are very expensive.

Accordingly, there is a need for an electrical measurement system and a method for establishing a desired offset with high precision that can be realized at lower costs.

SUMMARY

Embodiments of the present disclosure provide an electrical measurement system for performing a measurement on a device under test. The system comprises a main unit, a probe unit connected to the main unit, and a first offset generator for generating a first offset influencing the measurement, wherein the first offset generator has a first analog step size. The system also comprises a second offset generator for generating a second offset influencing the measurement, wherein the second offset generator has a second analog step size differing from the first analog step size.

Embodiments of the present disclosure also provide a method for establishing a desired total offset influencing a measurement performed by an electrical measurement system having a first offset generator and a second offset generator. The method comprises:

setting a desired total voltage value for the desired total offset in the measurement line;

providing the second offset generator with the desired total voltage value;

establishing a second offset by the second offset generator;

communicating to the first offset generator at least one of the desired total voltage value, the second offset, a second offset value being the value of the second offset, and a deviation value being the difference between the value of the second offset and the desired total voltage value; and establishing a first offset by the first offset generator in addition to the second offset as a function of at least one of the desired total voltage value, the deviation value, the second offset, and the second offset value.

The desired offset does not have to be generated by a single offset generator with broad range and high precision. The desired offset can efficiently be generated by two offset generators, namely an offset generator with a broad range but also a large analog step size and another offset generator with a small range but a small analog step size. This way, a costly D/A converter with a broad range and high precision is not necessary.

According to an aspect of the present disclosure, the electrical measurement system comprises a measurement line, the first offset and the second offset being generated in the measurement line, thus creating a total offset close to the desired offset.

For example, the first analog step size and the second analog step size depend on at least one of the voltage range and the resolution of the first offset generator or the second voltage generator, respectively. This way, different step sizes of the two offset generators can be achieved.

According to another aspect, at least one of the first offset generator and the second offset generator comprises a digital-to-analog converter to realize an offset generator at low cost.

In one embodiment, the main unit is an oscilloscope. Thus, a very versatile electrical measurement system can be realized.

In a further aspect, the main unit comprises a probe interface in order to efficiently communicate with the probe. The probe interface may be a Universal Serial Bus port (USB-port).

Further, the first offset generator and the second offset generator may be connected to each other via a data connection increasing the precision of the total offset generated by the offset generators. The data connection may be the probe interface.

In order to allow for precise handling of the probe, the probe in some embodiments may comprise a probe box and a probe head.

Generally, the probe box and the probe head are connected with each other via a configuration line and at least a portion of a measurement line of the electrical measurement system. Thus, a communication channel for transmitting the offset is established between the probe box and the probe head.

The second offset generator in some embodiments may be provided in the probe box. This way, it is assured that the second offset generator always suits the probe head.

According to another aspect, the second offset generator is configured to receive a desired total voltage value representing a desired offset and to adjust the second offset as a function of the desired total voltage value. The second offset generator in some embodiments may have a broad range with a large analog step size. The second offset generator can therefore provide a major part of the desired offset.

The first offset generator in some embodiments may be configured to receive at least one of the deviation voltage value, the second offset value and the second offset and may be configured to adjust the first offset as a function of at least one of the total voltage value, the deviation voltage value, the second offset value and the second offset. By this technique, the total offset generated by the first and second offset generator amounts to the desired offset as closely as possible, for example as close as one analog step size of the first offset generator.

The first offset generator in some embodiments may have a limited range, i.e. a range corresponding to a single analog step size of the second offset generator, and a high precision, i.e. a very small analog step size.

In order to establish an efficient connection between the first offset generator and the second offset generator, at least one of the total voltage value, the deviation voltage value, the second offset value and the second offset may be communicated in some embodiments via the probe interface.

For facilitating the adjustment of the desired total voltage value, the main unit in some embodiments may comprise a user interface for setting the desired total voltage value. And the desired total voltage value may be input via the user interface of the measurement system.

In order to generate an offset as close as possible to the desired total offset, the first offset and the second offset in some embodiments may constitute at least part of the total offset influencing the measurement, the total offset may differ at most from that total voltage value by at least one of an analog step size of the first offset generator and an analog step size of the second offset generator.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
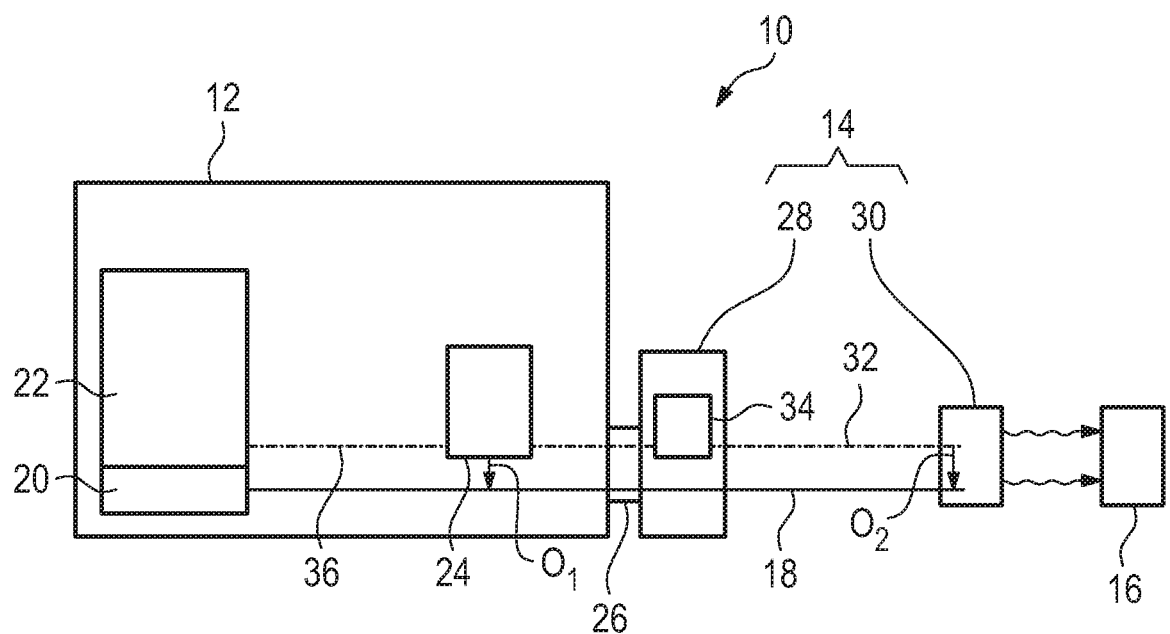
FIG. 1 shows a schematic overview of one representative embodiment of an electrical measurement system according to the disclosure.

In FIG. 1, an electrical measurement system 10 with a main unit 12 and a probe unit 14 is shown. Further, a device under test 16 is illustrated. The device under test 16 is contacted by the probe unit 14 to perform a measurement.

The electrical measurement system 10 further comprises a measurement line 18 extending through the main unit 12 and the probe unit 14. The measurement line 18 is used to transmit a measurement signal generated by the probe unit 14 to the main unit 12.

The main unit 12 may be an oscilloscope and comprises a signal processing unit 20 connected with the measurement line 18, a user interface 22, a first offset generator 24, and a probe interface 26. The probe interface 26 may be a Universal Serial Bus port (USB-port). The probe unit 14 is connected to the main unit 12 via the probe interface 26.

In the shown embodiment, the probe unit 14 comprises a probe box 28 and a probe head 30. The probe box 28 is attached to the probe interface 26 and provides a connection between the probe unit 14 and the main unit 12. The probe head 30 connects to the device under test 16 for creating the measurement signal. The measurement line 18 extends from the probe head 30 via the probe box 28 and the probe interface 26 to the signal processing unit 20 of the main unit 12.

Further, the probe box 28 and the probe head 30 are connected via a configuration line 32. The configuration line 32 and the measurement line 18 between the probe box 28 and the probe head 30 may be a single multi-core cable or several cables connecting the probe box 28 with the probe head 30.

The probe box 28 comprises a second offset generator 34. The second offset generator 34 of the probe box 28 is connected to the first offset generator 24 of the main unit 12 via a data connection 36. The data connection 36 may run through the probe interface 26.

The data connection 36 may extend from the second offset generator 34 to the user interface 22 or, in a different embodiment, another data connection may be used to connect the user interface 22 with the second offset generator 34.

The first offset generator 24 and the second offset generator 34 each are configured to generate an offset in the measurement line 18, depicted by arrows in FIG. 1, for example by applying voltages to the measurement line 18. The first offset generator 24 and the second offset generator 34 each comprise at least one digital-to-analog converter (D/A converter) for generating the respective offset.

The first offset generator 24 has a first analog step size $\Delta_1$ and the second offset generator 34 has a second analog step size $\Delta_2$ differing from the first analog step size $\Delta_1$. The different step sizes $\Delta_1$, $\Delta_2$ are shown in the graph of FIG. 2 that will be described later with regard to the usage of the electrical measurement system 10.

The first and second analog step sizes $\Delta_1$, $\Delta_2$ depend from the voltage range and the resolution of the first offset generator 24 and the second offset generator 34, respectively. For example, the first offset generator 24, more precisely the D/A converter, has a voltage range of about 60 V and a resolution of 16 bit leading to a first analog step size $\Delta_1$ of about 1 mV. The second offset generator 34, more precisely the D/A converter, may have a voltage range of about 10 mV and a resolution of 16 bit, leading to a second analog step size $\Delta_2$ of about 100 nV.

The first offset generator 24 and the second offset generator 34 may each be equipped with a processing unit, controlling the offset generated by the respective offset generator 24, 34. In some embodiments, it is also possible that the offset generators 24, 34 are controlled by the processing unit of the main unit 12 doing the necessary calculations to determine the respective offset.

Figure 2:
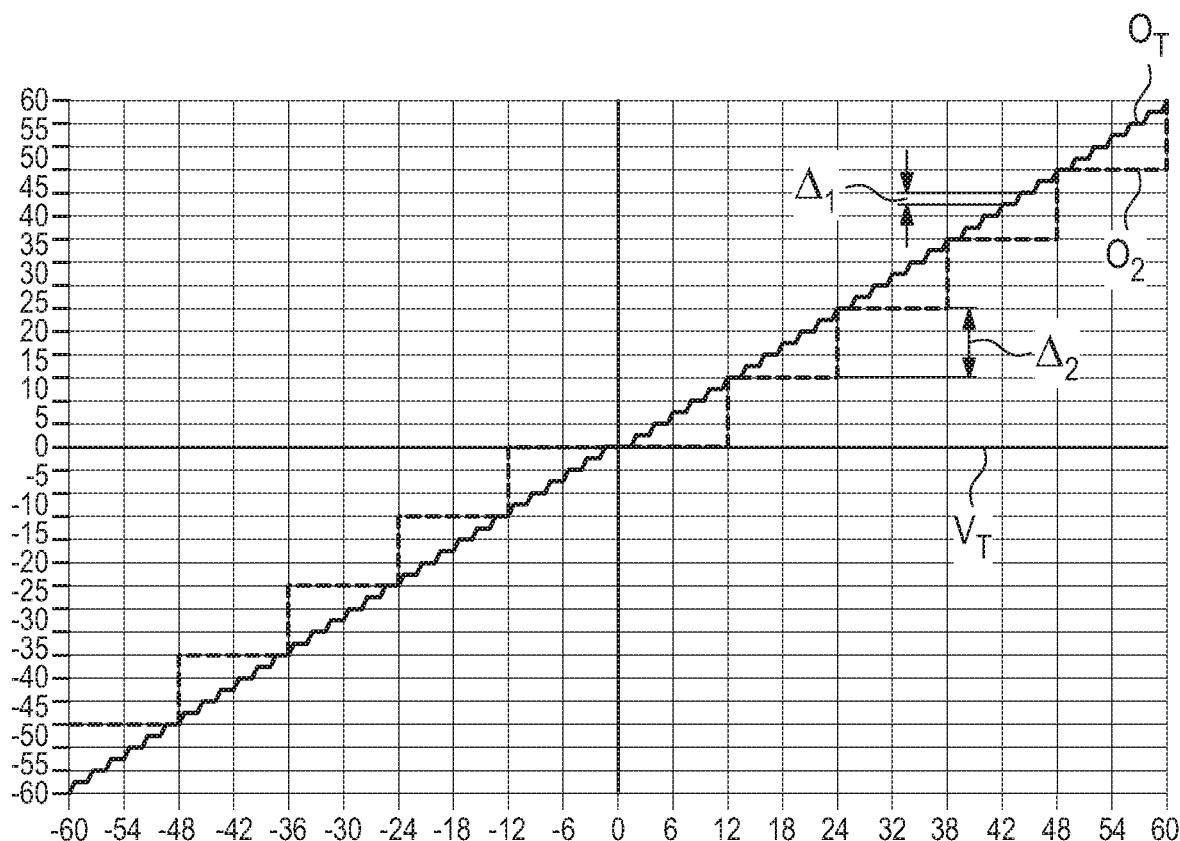
FIG. 2 shows a graph illustrating a second offset and the total offset generated in a measurement line of said electrical measurement system according to FIG. 1 for different desired offsets.
Figure 3:
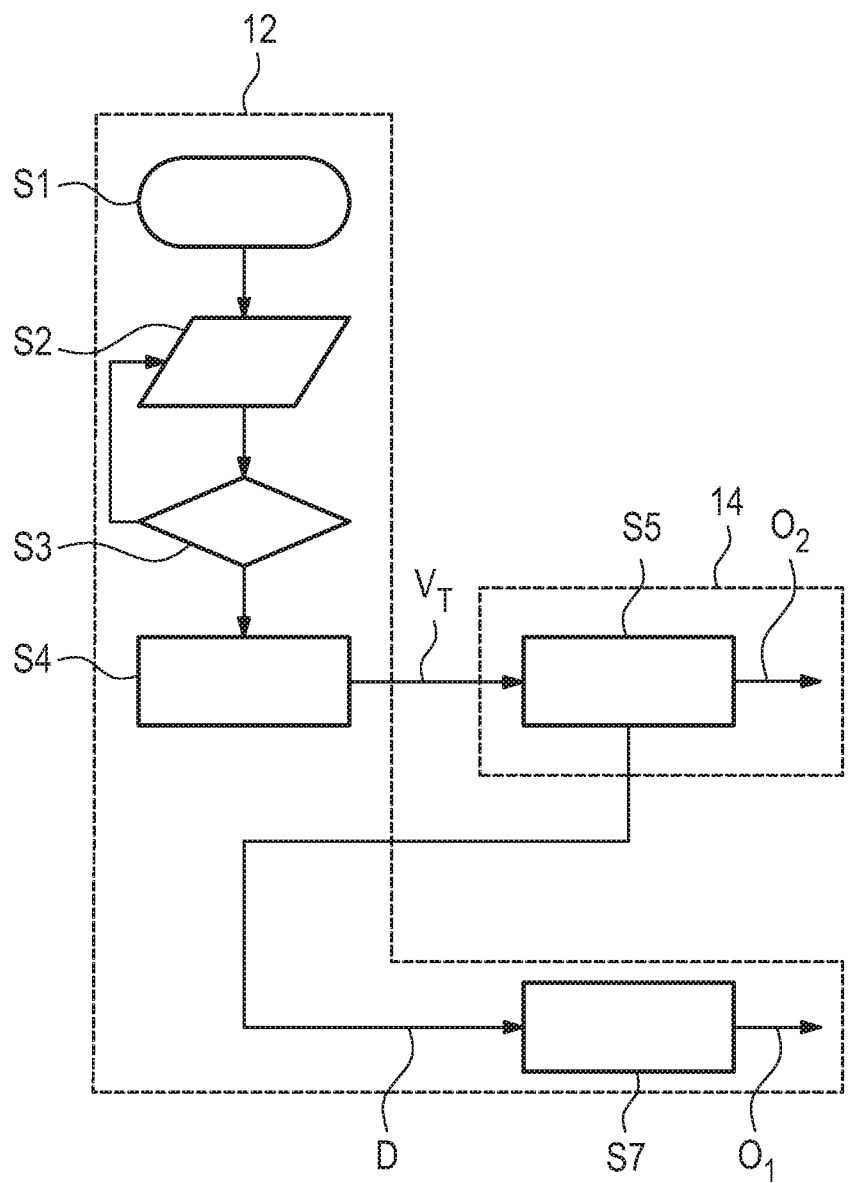
FIG. 3 shows schematically a flow chart of one embodiment of a method according to the disclosure.

The usage of the electrical measurement system 10 with the first offset generator 24 and the second offset generator 34 is illustrated in FIGS. 2 and 3.

For performing a measurement on the device under test 16, the probe head 30 is brought into contact with the device under test 16 (Step S1). The probe box 28 supplies the voltage needed for the probe head 30 and communicates via the probe interface 26 with the main unit 12.

If an offset is needed for the particular measurement, the user of the electrical measurement system 10 inputs the desired total offset in the main unit 12 via the user interface 22 (step S2). The user interface 22 may be provided by a touch-sensitive display of the main unit 12 such that the user can input the desired total offset by touching the display.

This can be done by either inputting a desired total voltage value or by increasing or decreasing the desired total offset, for example via a knob. Of course, other methods of input or input units can be used as well, for example voice recognition or via a touch-sensitive display.

It is checked in regular intervals by the main unit 12 if the desired total offset has been changed (step S3). If so, the desired total offset is processed in step S4 to determine the desired total voltage value $V_T$. This total voltage value $V_T$ is then transmitted to the second offset generator 34 via the data connection 36 and the probe interface 26.

The second offset generator 34 receives the desired total voltage value $V_T$ and generates the second offset $O_2$ as a function of the desired total voltage value $V_T$. For example, the second offset generator 34 creates a second offset $O_2$ having a voltage as close to the desired total voltage value $V_T$ as the second analog step size $\Delta_2$ allows (step S5).

In the embodiment of FIG. 3 the second offset $O_2$ is transmitted to the probe head 30 via the configuration line 32.

In the probe head 30, the second offset $O_2$ is then applied to the measurement line 18 (see right-hand arrow in FIG. 1).

It is also possible that the second offset $O_2$ is applied to the measurement line 18 at the probe box 28.

Further, the second offset generator 34 calculates a deviation value D. The deviation value D is the difference between the desired total voltage value $V_T$ and the second offset $O_2$.

The deviation voltage D is then transmitted to the main unit 12, more exactly the first offset generator 24, via the probe interface 26 and the data connection 36.

The first offset generator 24 generates a first offset $O_1$ as a function of the deviation value D. The value of the first offset $O_1$ is set as close as possible to the deviation value D as the first analog step size $\Delta_1$ allows.

The first offset $O_1$ is then fed into the measurement line 18 in the main unit 12 (illustrated as the left-hand arrow in FIG. 1) in step S7.

The sum of the first offset $O_1$ and the second offset $O_2$, i.e. the total offset $O_T$, differs from the total voltage value $V_T$ by an amount equal to or smaller than the first analog step size $\Delta_1$ of the first offset generator 24.

The step size of the total offset $O_T$ is the smaller one of the first analog step size $\Delta_1$ and the second analog step size $\Delta_2$, in the shown embodiment thus the first analog step size $\Delta_1$.

FIG. 2 illustrates with arbitrary units the first offset $O_1$ and the total offset $O_T$ for different desired total voltage values $V_T$. It can be seen that the voltage range of the total offset $O_T$ is provided by the second offset $O_2$, i.e. it amounts to the voltage range of the second offset generator 34, whereas the step size of the total voltage $O_T$ is the same as the fine first analog step size $\Delta_1$ of the first offset generator 24.

Thus, a total offset $O_T$ with a very fine step size can be created over a broad voltage range without a high resolution D/A converter.

Figure 4:
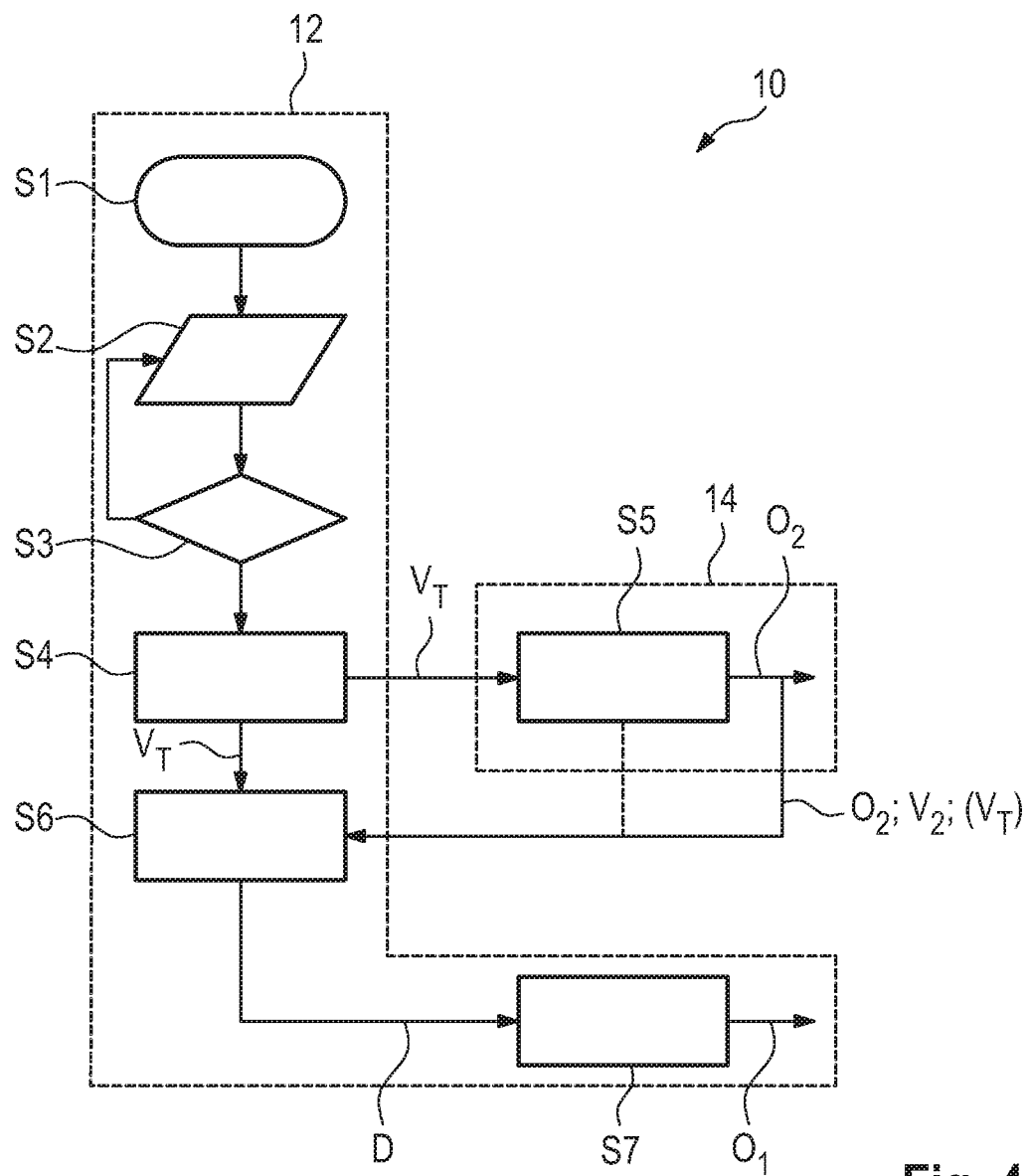
FIG. 4 shows schematically a flow chart of a second embodiment of a method according to the disclosure.

In FIG. 4, a variation of the method shown in FIG. 3 is illustrated. The method according to the second embodiment is substantially the same as the method shown in FIG. 3 so that the same reference numerals for the same or similar steps are used. Only the differences are explained in the following.

In the second embodiment, different values are communicated from the second offset generator 34 to the first offset generator 24 than in the first embodiment.

In the second embodiment, the second offset generator 34 does not calculate the deviation value D but it transmits the second offset $O_2$ or a second offset value $V_2$ being the voltage value of said second offset $O_2$ to the main unit 12 via the probe interface 26.

The first offset generator 24 receives the second offset $O_2$ or the second offset value $V_2$. The first offset generator 24 is further provided with the total voltage value $V_T$, for example by the user interface 22, the second offset generator 34 or other units of the electrical measurement system 10.

Then, the deviation value D is calculated using the second offset $O_2$ or the second offset value $V_2$ and the total voltage value $V_T$ (step S6).

The deviation value D, also called the remainder, is then used by the first offset generator 24 to generate the offset $O_1$ (step S7) as explained above.

In general, the first offset generator 24 generating the first offset $O_1$ is used to correct the deviation between the desired total voltage value and the offset value that can be set via the second offset generator 34. The second offset generator 34 is relatively coarse with respect to the first offset generator 24 having an analog step size $\Delta_2$ of about 100 nV. Thus, high precision is ensured in an easy manner while using an electrical measurement system as described above.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An electrical measurement system for performing a measurement on a device under test, comprising:
   a main unit;
   a probe unit connected to said main unit;
   a first offset generator configured to generate a first offset influencing said measurement, said first offset generator having a first analog step size; and
   a second offset generator configured to generate a second offset influencing said measurement, said second offset generator having a second analog step size differing from said first analog step size.

2. The electrical measurement system according to claim 1, wherein said electrical measurement system comprises a measurement line, said first offset and said second offset being generated in said measurement line.

3. The electrical measurement system according to claim 1, wherein said first analog step size and said second analog step size depend on at least one of the voltage range and the resolution of said first offset generator or said second voltage generator, respectively.

4. The electrical measurement system according to claim 1, wherein at least one of said first offset generator and said second offset generator comprises a digital-to-analog converter.

5. The electrical measurement system according to claim 1, wherein said main unit is an oscilloscope.

6. The electrical measurement system according to claim 1, wherein said main unit comprises a probe interface.

7. The electrical measurement system according to claim 1, wherein said first offset generator and said second offset generator are connected to each other via a data connection.

8. The electrical measurement system according to claim 1, wherein said first offset generator is provided in said main unit and said second offset generator is provided in said probe unit.

9. The electrical measurement system according to claim 1, wherein said probe unit comprises a probe box and a probe head.

10. The electrical measurement system according to claim 9, wherein said probe box and said probe head are connected with each other via a configuration line and at least a portion of a measurement line of said electrical measurement system.

11. The electrical measurement system according to claim 9, wherein said second offset generator is provided in said probe box.

12. The electrical measurement system according to claim 1, wherein said second offset generator is configured to receive a desired total voltage value representing a desired offset and to adjust said second offset as a function of said desired total voltage value.

13. The electrical measurement system according to claim 12, wherein said second offset generator is configured to determine at least one of a second offset value being the value of said second offset and a deviation voltage value being the difference between the value of said second offset and said desired total voltage value.

14. The electrical measurement system according to claim 13, wherein said first offset generator is configured to receive at least one of said deviation voltage value, said second offset value and said second offset and to adjust said first offset as a function of at least one of said total voltage value, said deviation voltage value, said second offset value and said second offset.

15. The electrical measurement system according to claim 14, wherein at least one of said total voltage value, said deviation voltage value, said second offset value and said second offset is communicated via said probe interface.

16. The electrical measurement system according to claim 12, wherein said main unit comprises a user interface for setting said desired total voltage value.

17. A method for establishing a desired total offset influencing a measurement performed by an electrical measurement system having a first offset generator and a second offset generator, the method comprising:
setting a desired total voltage value for said desired total offset in said measurement line;
providing said second offset generator with said desired total voltage value;
establishing a second offset by said second offset generator;
communicating to said first offset generator at least one of said desired total voltage value, said second offset, a second offset value being the value of said second offset, and a deviation value being the difference between the value of said second offset and said desired total voltage value; and
establishing a first offset by said first offset generator in addition to said second offset as a function of at least one of said desired total voltage value, said deviation value, said second offset, and said second offset value.

18. The method according to claim 17, wherein said first offset and said second offset being generated in a measurement line of said electrical measurement system.

19. The method according to claim 17, wherein said desired total voltage value is input via a user interface of said measurement system.

20. The method according to claim 17, wherein said first offset and said second offset constitute at least parts of a total offset influencing said measurement, said total offset differing at most from said total voltage value by at least one of an analog step size of said first offset generator and an analog step size of said second offset generator.

* * * * *